United States Patent [19]
Ikeda

[11] Patent Number: 4,654,882
[45] Date of Patent: Mar. 31, 1987

[54] RADIO COMMUNICATION DEVICE AND METHOD OF CONTROLLING TRANSMITTER OUTPUT POWER

[75] Inventor: Shigeki Ikeda, Tokyo, Japan
[73] Assignee: NEC Corporation, Japan
[21] Appl. No.: 723,633
[22] Filed: Apr. 15, 1985
[30] Foreign Application Priority Data
   Apr. 19, 1984 [JP] Japan .................................. 59-78967
[51] Int. Cl.$^4$ ............................................. H04B 1/40
[52] U.S. Cl. ........................................ 455/88; 455/89; 455/90; 455/95; 455/117; 455/126; 455/129
[58] Field of Search .................... 455/88, 89, 90, 95, 455/99, 74, 84, 117, 126, 129

[56] References Cited
U.S. PATENT DOCUMENTS

| | | | |
|---|---|---|---|
| 4,095,184 | 6/1978 | Hochstein et al. | 455/127 |
| 4,373,206 | 2/1983 | Suzuki et al. | 455/126 |
| 4,392,245 | 7/1983 | Mitama | 455/117 |
| 4,563,775 | 1/1986 | Yokosuka | 455/126 |

Primary Examiner—Robert L. Griffin
Assistant Examiner—Elissa Seidenglanz
Attorney, Agent, or Firm—Laff, Whitesel, Conte & Saret

[57] ABSTRACT

A radio communication device comprises a portable communication device and a power amplifier device adapted to accommodating the portable communication device thereinto for amplifying a transmitter output therefrom. The radio communication device further comprises a detector circuit for detecting that an electrical coupling between the portable communication device and the power amplifier device, thereby effecting a control such that the transmitter output power level is kept at a minimum input level required for the power amplifier device. Thus, this can suppress exceesive heat generation in the communication device when the portable communication device is used by being accomodated in the power amplifier device.

7 Claims, 6 Drawing Figures

RADIO COMMUNICATION DEVICE AND METHOD OF CONTROLLING TRANSMITTER OUTPUT POWER

BACKGROUND OF THE INVENTION

The present invention relates to a radio communication system, and more particularly to a radio communication device comprising a portable communication device and a power amplifier device connectable to the portable communication device to amplify a transmitter output therefrom. Specifically, the present invention is concerned with a method of effecting a control such that transmitter output power level of the portable communication device is kept at a minimum level required for the power amplifier device.

In general, portable or handy type radio communication devices have restrictions in respect to a battery capacity and a heat dissipation structure. Accordingly, their transmitter output is limited to about several of hundreds of mW (milliwatt) to about several watts. Such a transmitter output is of a small value as compared to that of a radio communication device carried on a vehicle or a fixed radio communication device. In other words, in case where a larger transmitter output is needed, it is necessary to provide an amplifier device connectable to the portable communication device for amplifying its transmitter output.

The configuration of a conventional communication device designed in consideration of the above and its problems will be described in connection with the case where the communication device is applied to a mobile communication system e.g. a vehicle telephone communication.

FIG. 1 is a block diagram illustrating a mobile communication device comprising a removably fitting unit 100 serving as a portable communication device and a fixed unit 200 serving as a power amplifier device into which the portable communication device 100 is removably fitted. The configuration of these units 100 and 200 will be briefly described as follows. The removably fitting 100 is provided with an antenna 102, an antenna switch 104 coupled to the antenna 102, a duplexer 106 coupled to the antenna switch 104 to switch a signal path, a receiver circuit 108 coupled to the duplexer 106, a control circuit 110 coupled to the receiver circuit 108, a transmitter circuit 112 coupled to the control circuit 110, a synthesizer 114 to control the receiver circuit 108 and the transmitter circuit 112 in accordance with a control signal from the control circuit 110, a power amplifier circuit 116 coupled between the transmitter circuit 112 and the duplexer 106, and a telephone loudspeaker/microphone 118. Reference numeral 120 denotes a battery. The fixed unit 200 is provided with an antenna 202, a duplexer 204 coupled to the antenna 202, an RF (radio frequency) amplifier 206 coupled to the duplexer 204, a circulator 208 coupled to the RF amplifier 206 and connectable to the above-mentioned antenna switch 104, and a power amplifier circuit 210 coupled between the circulator 208 and the duplexer 204. The fixed unit 200 is further provided with a control circuit 212 capable of effecting a mutual communication with the control circuit 110 provided in the removably fitting unit 100, and an electric charger 214 coupled to a power supply circuit 216 to charge the battery 120 provided in the removably fitting unit 100, when the removably fitting unit 100 is fitted into the fixed unit 200 in order to establish an electrical coupling therebetween. Signal flows are indicated by arrow.

When the removably fitting unit 100 is connected with the fixed unit 200, a power supply in the removably fitting unit 100 is switched from the battery 120 to a battery embarked in a vehicle. As a result, the battery 120 is charged by the charger 214. At this time, since the antenna switch 104 becomes operartive, a signal is received by the vehicle antenna 202 instead of the antenna 102. Upon establishment of an eletrical connection between the removably fitting unit 100 and the fixed unit 200, signal transmission is mutually effected between the control circuits 110 and 212.

FIG. 2 shows a cirucit configuration of the conventional radio communication device C1, obtained by extracting the parts relevant to the invention from the entire system configuration shown in FIG. 1 for the purpose of facilitating the description.

As shown in this figure, the portable communication device 100 comprises an input terminal 1, an amplifier 3 for amplifying an input signal, a power detector circuit 5 connected to the output of the amplifier 3, a differential amplifier 7 responsive to the difference between an output from the power detector circuit 5 and a reference voltage supplied from an input terminal 11 to produce an output signal, and a signal converter circuit 9 responsive to the output signal from the differential circuit 7 to produce a control signal for a control of the amplifier 3. The power detector 5 may comprise a directional coupler and a diode. Reference numeral 13a denotes an output terminal. The power detector circuit 5, the differential amplifier 7 and the signal converter circuit 9 constitutes an automatic output power control circuit. The power amplifier device 200 has a circuit configuration similar to that of the portable communication device 100. Reference numerals 4, 6, 12, 8 and 10 denote an amplifier, a power detector circuit, a reference voltage input terminal, a differential amplifier and a signal converter circuit, respectively, and reference numerals 13b and 14 denote an input terminal and an output terminal, respectively. The power detector circuit 6, the differential amplifier 8 and the signal converter circuit 10 constitutes an automatic output power control circuit.

An explanation will be made in connection with a serious problem occurring in designing heat dissipation structure of the portable radio communication device when the conventional radio communication configured as shown in FIG. 2 is used.

FIG. 3 is a perspective view showing the radio communication device C1 comprising the portable communication device 100 and the power amplifier device 200 provided with the circuit connectable with the communication device 100 for amplifying a transmitter output. In addition to the connecting system shown in FIG. 3, there are proposed various methods of connecting the portable communication device 100 with the power amplifier device 200. Taking into consideration appearance, convenience in using, volume and shock-proof characteristic etc., it is preferable to connect the device 100 with the device 200 in a manner that most part or the entirety of the communication device 100 is accommodated into the amplifier device 200 as shown in FIG. 3. Accordingly, such a system is ordinarily employed.

Primarily, the portable communication device 100 is so designed as to be used in an atmospheric environment. Further, the device 100 requires appearance and weight which impose restrictions on the design of heat dissipation structure. Accordingly, when the accommodating system as shown in FIG. 3 is adopted, ventilation around the portable communication device 100 is liable to be degraded with consequent elevation in temperature, thus considerably impairing heat dissipation effect.

To be more specific, in the radio communication device C1 based on the connecting system as shown in FIG. 3, irrespective of the fact that the portable communication device 100 is solely used or it is combined with the power amplifier device 200, the device 100 is designed so as to produce the output amounting to several of hundreds of mW to several W, thus producing the same amount of heat in both the usages. For this reason, in the case of using the portable communication device 100 and the power amplifier device 200 connected to each other, the temperature elevation in the portable communication device 100 is far beyond a setting value in the case of sole use of the portable communication device. This results in not only a bad influence on various kinds of circuit characteristics but also likelihood to degrade reliability, thus producing a serious problem in the radio communication device.

SUMMARY OF THE INVENTION

An object of the present invention is to provide a radio communication device which can solve a problem of excessive heat generation in the communication device when a portable communication device is accommodated into a power amplifier device in a manner stated above.

According to the present invention, there is provided a radio communication device comprising; first device means provided with a radio transmitter and receiver circuit; second device means adapted to be electrically coupled to the first device means and for amplifying a transmitter output power level therefrom; and detector means for detecting that an electrical coupling between the first and second device means is established, thereby effecting a control such that the transmitter output power level is suppressed to a minimum input level required for the second device means. The detector means may comprise a detector circuit operative to produce information indicative of the establishment of the electrical coupling between the first and second device means.

The first device means may be configured as a radio communication circuit comprising a power amplifier, and an automatic output power control circuit coupled to the power amplifier to control the power amplifier depending upon an output level of the power amplifier, the detector circuit being coupled to the automatic output power control circuit, whereby the automatic output power control circuit becomes operative to vary the output level of the power amplifier in accordance with the information from the detector circuit.

The automatic output power control circuit may comprise an output power detector coupled to the power amplifier, a differential amplifier responsive to a difference between the output level of the power detector and a reference voltage, and a control signal converter for converting an output from the differential amplifier into a control signal for controlling the power amplifier.

The automatic output power control circuit further comprises a reference voltage producing circuit for producing the reference voltage.

The detector circuit may be configured as a circuit for voltage-dividing the reference voltage from the reference voltage producing circuit.

The first device means may be adapted to be removably fitted into the second device means.

The detector means may include a variable resistor and a switch responsive to the establishment of an electrical connection between the portable communication means and the amplifier means.

The detector means may be provided, at the first device means, with a switch element, a contact provided at the switch element, a movable pin, and a first connector, and at the second device means with a projection and a second connector, whereby when the first device means is fitted into the second device means, the projection pushes the pin to turn on the switch element.

The first and second device means are provided with control circuit which can be mutually communicated with each other, whereby when the control unit is operative to deliver a power-down signal to the reference voltage producing circuit in response to information indicative of establishment of the electrical connection between the first and second device means to turn on a switch element, a control is effected such that an output level of the power amplifier is suppressed to a minimum input level required for the power amplifier means.

According to the present invention, there is also provided a method of controlling a transmitter output power level of a radio communication device comprising portable radio communication means provided with a radio transmitter and receiver circuit and power amplifier means adapted to be electrically coupled to the radio communication means and for amplifying a transmitter output therefrom, characterized in that the method comprises the steps of detecting that an electrical coupling between the portable communication means and the power amplifier means is established, and effecting a control such that the transmitter output level is kept at a minimum level required for the power amplifier means.

BRIEF DESCRIPTION OF THE DRAWINGS

The features and advantages of a radio communication device according to the present invention will become more apparent from the following description taken in conjunction with the accompanying drawings, in which.

DETAILED DESCRIPTION OF THE PREFERRED EMBODIMENT

Figure 4:
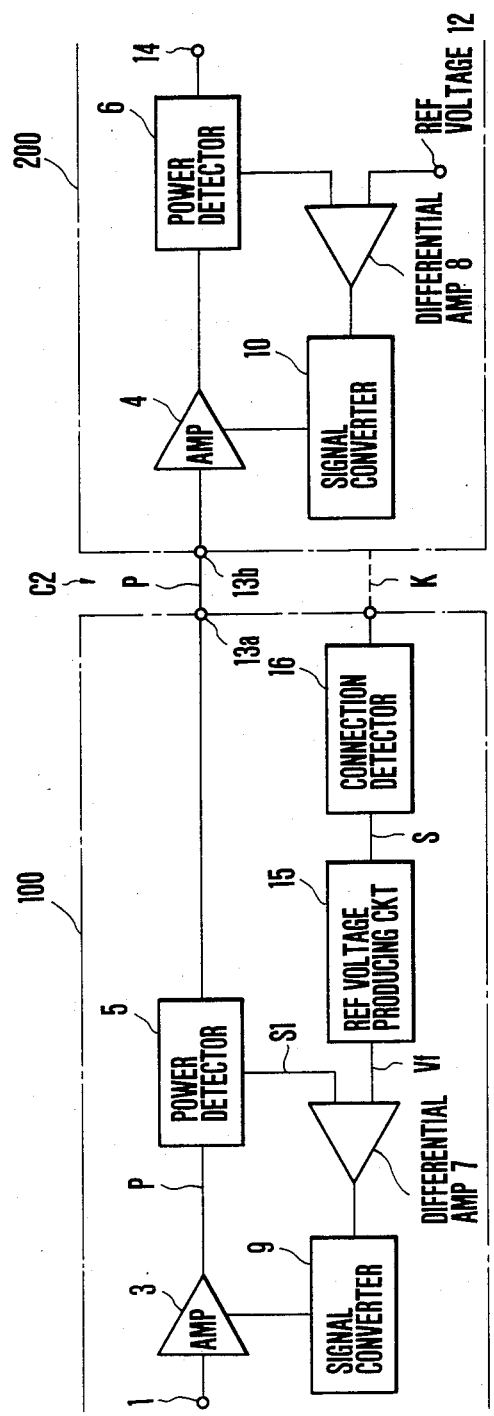
FIG. 4 is a circuit diagram illustrating an embodiment of a radio communication device according to the present invention.

A preferred embodiment of radio transmitter according to the present invention will be described with reference to attached drawings. FIG. 4 is a circuit diagram illustrating the embodiment of the invention.

Figure 2:
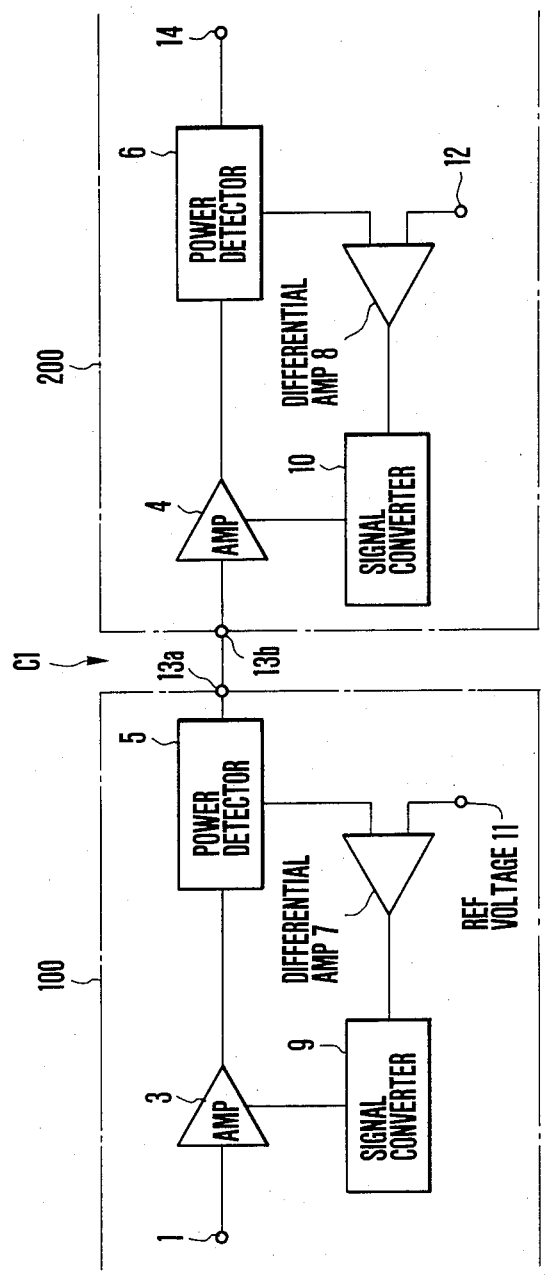
FIG. 2 is a circuit diagram illustrating a conventional radio communication device.
Figure 3:
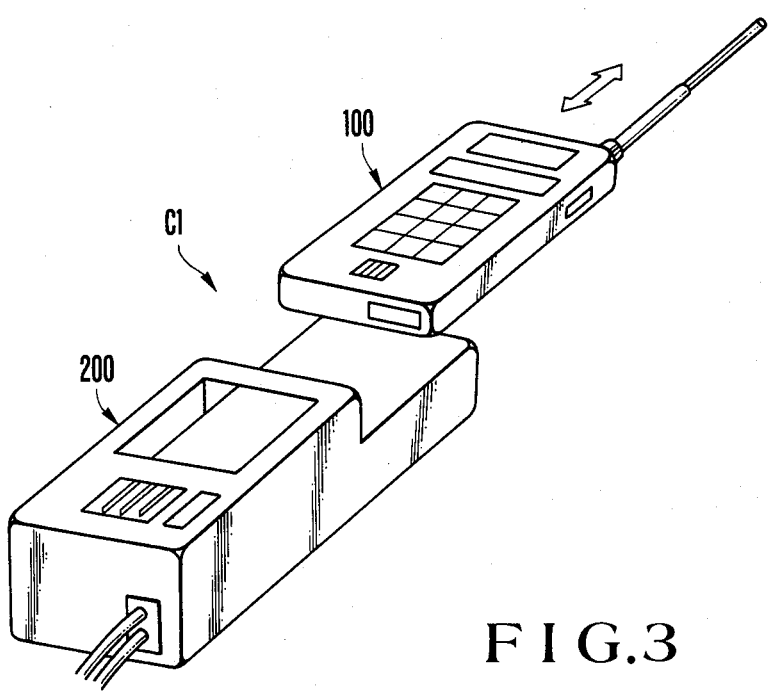
FIG. 3 is a perspective view showing a connecting system for accommodating a portable communication device into a power amplifier device in the device shown in FIG. 2.

As understood from FIG. 2, the portable communication device 100 and the amplifier device 200 are provided with the power amplifier and the automatic output power control circuit, in an independent manner, respectively. For this reason, in the case of using the portable communication device 100 with it being connected to the power amplifier device 200, the power amplifier 3 provided in the portable communication device 100 dissipates the same amount of power as that when solely the portable communication device 100 is used. This brings about a problem in heat dissipation as previously mentioned.

In contrast, in the preferred embodiment shown in FIG. 4, the portable communication device 100 is further provided with a circuit for adjusting a reference voltage comprising a circuit 15 operative to produce a controllable reference voltage $V_f$ and a detector circuit 16 for detecting that an electrical connection or coupling between the communication device 100 and the amplifier device 200 is established.

Accordingly, when the communication device 100 is connected to the power amplifier device 200, the detector circuit 16 becomes operative to convert information K indicating that the power amplifier device 200 is connected to the communication device 100 into an electric signal S which in turn is delivered to the controllable reference voltage producing circuit 15. The circuit 15 becomes operative to produce a reference voltage $V_f$ in response to the electric signal S. Thus, the power amplifier 3 is controlled so that its output power is lowered in accordance with an output from the differential amplifier 7 which amplifies the difference between the modified reference voltage $V_f$ and a dc signal $S_1$ from the output power detector circuit 5.

In this instance, when the power amplifier 4 has a sufficiently large gain, it is possible to use a relatively small value as power level applied to the input terminal 13b, i.e., an output power level P of the portable communication device 100. For instance, where the power amplifier 4 has a gain of 30 dB and the power amplifier device 200 is required to produce an output power level of 10 W from the output terminal 14, it is required to input a power level of 10 mW to the input terminal 13. The power amplifier 3 provided in the portable communication device 100 has ability to produce an output of several of hundreds of mW to several W to ensure that the portable communication device 100 can be used alone. For this reason, a measure for lowering an output power level P of the portable communication device 100 is required. In the above-mentioned discussion, it is assumed that there is no problem of heat dissipation in the power amplifier device 200, and the overall gain of the radio communication device C2 of the invention is equal to that of the conventional radio communication device C1 shown in FIG. 2.

Figure 5:
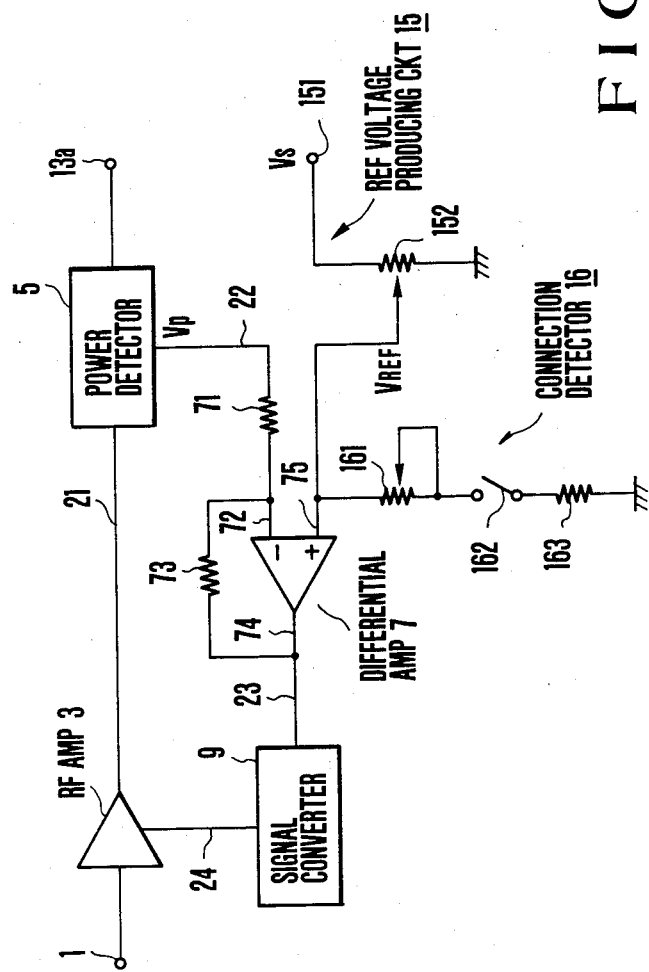
FIG. 5 is a circuit diagram showing details of FIG. 4.

FIG. 5 is a detailed circuit diagram illustrating an embodiment according to the present invention wherein circuit components identical to those shown in FIG. 4 are designated by the same reference numerals, respectively. An input signal to the input terminal 1 is amplified by the power amplifier 3. The signal thus amplified is delivered to the power detector circuit 5 through a line 21. The signal passed through the power detector circuit 5 is outputted from the output terminal 13a. The output signal $V_p$ detected by the detector circuit 5 is applied to a resistor 71 through a line 22 and then is inputted to an inverting input terminal 72 of the differential amplifier 7. A feedback resistor 73 is connected between an output terminal 74 and the inverting input terminal 72 to form a feedfack loop. The differential amplifier 7 provided with the feedback resistor may be constituted by a comparison circuit. A power supply voltage Vs is applied to a power supply voltage terminal 151. A variable resistor 152 to which the power supply voltage Vs is applied constitutes the circuit 15 which is operative to produce a desired reference voltage by adjusting the value of the variable resistor 152. The reference voltage $V_{REF}$ thus produced is inputted to a non-inverting input terminal 75 of the differential amplifier 7. The differential amplifier 7 becomes operative to compare the output signal inputted to the inverting input terminal 72 with the reference voltage $V_{REF}$ inputted to the non-inverting input terminal 75 to amplify the difference therebetween, thus producing a control signal on the output terminal 74. The control signal is inputted to the control signal converter circuit 9 through a line 23. The control signal converter circuit 9 becomes operative to convert the control signal into a voltage suitable for control of the power amplifier 3. The voltage thus obtained is applied to the power amplifier 3 through a line 24. This control voltage is proportional to the difference between the reference voltage $V_{REF}$ and the output signal. Accordingly, the output power of the communication device varies inversely proportional to the control voltage. This provides an effect for allowing the output power to return to its initial value. Namely, the output power is kept constant by varying the control voltage so that the output voltage and the reference voltage $V_{REF}$ are equal to each other.

Further, as shown in FIG. 5, the detector circuit 16 comprises a variable resistor 161, a switch 162 and a resistor 163 which are connected in series between the non-inverting input terminal 75 of the differential amplifier 7 and ground. When the removably fitting unit (portable communication device) 100 is solely used, the switch 162 is cut off. Accordingly, the resistors 161 and 163 do not serve as a voltage divider. When the removably fitting unit 100 and the fixed unit 200 are connected to each other, the switch 162 turns on. As a result, the non-inverting input terminal 75 of the differential amplifier 7 is also connected to ground through the resistors 161 and 163. Thus, the setting of the reference voltage $V_{REF}$ can be effected not only by the variable resistor 152 but also by the variable resistor 161 and the resistor 163. It is now assumed that the resistance value of the variable resistor 152 between its slider and one end close to ground is $R_{152}'$ and its maximum resistance value is $R_{152}$ and the resistance values of the resistors 161 and 163 are $R_{161}'$ and $R_{163}$, respectively.

When the switch 162 is turned off, the reference voltage is expressed as follows.

$$V_{REF} = V_s R_{152}' / R_{152}$$

When the switch 162 is turned on, the reference voltage is expressed as follows.

$$V_{REF}' = V_S \cdot \frac{\frac{R_{152}'(R_{161}' + R_{163})}{R_{152}' + R_{161}' + R_{163}}}{R_{152} - R_{152}' + \frac{R_{152}'(R_{161}' + R_{163})}{R_{152}' + R_{161}' + R_{163}}}$$

$$= V_S \cdot \frac{R_{152}'(R_{161}' + R_{163})}{R_{152}(R_{152}' + R_{161}' + R_{163}) - R_{152}'^2}$$

$$\frac{R_{152}(R_{152}' + R_{161}' + R_{163}) - R_{152}'^2}{R_{161}' + R_{163}} - R_{152} =$$

$$\frac{R_{152}'(R_{152} - R_{152}')}{R_{161}' + R_{163}} \geq 0 \ (\because R_{152} \geq R_{152}')$$

Therefore, $V'_{REF} \leq V_{REF}$

Accordingly, when the switch 162 is turned on, the reference voltage $V_{REF}'$ becomes smaller than that when the switch 162 is cut off. As a result, the output power of the removably fitting unit is reduced.

Figure 6:
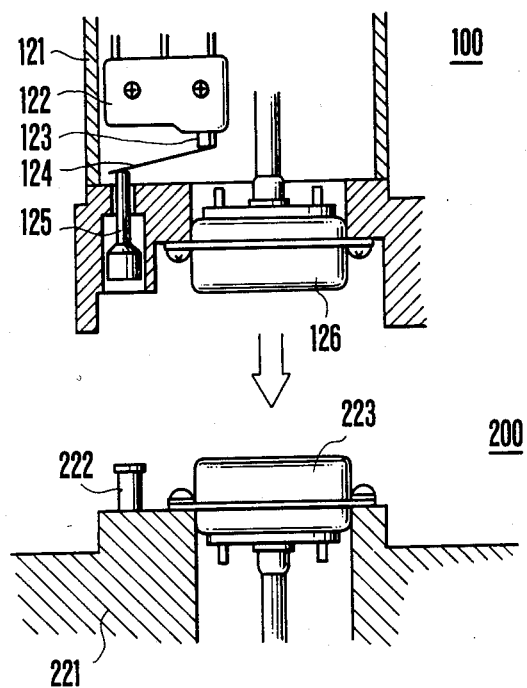
FIG. 6 is a cross sectional view illustrating an example of a connection detector switch employed in the present invention.

FIG. 6 is a cross sectional view illustrating the connection detector switch 162. The switch 162 is provided on the side of the removably fitting unit 100 with a casing 121, a switch element 122, an electrical contact 123, a lever 124, a pin 125, and a connector 126 and on the side of the fixed unit 200, casing 221, a projection 222 and a connector 223. When the removably fitting unit 100 is connected to the fixed unit 200, the pin 125 is moved upwards by the projection 222 to bring the lever 124 into contact with the contact 123 to thereby turn on the switch element 122. On the contrary, when the removably fitting unit 100 is removed or separated from the fixed unit 200, the pin 125 moves downwards so that the lever 124 is released from the contact 123, thus turning off the switch element 122. The both connectors 126 and 223 are connected when the removably fitting unit 100 and the fixed unit 200 are connected to each other.

Figure 1:
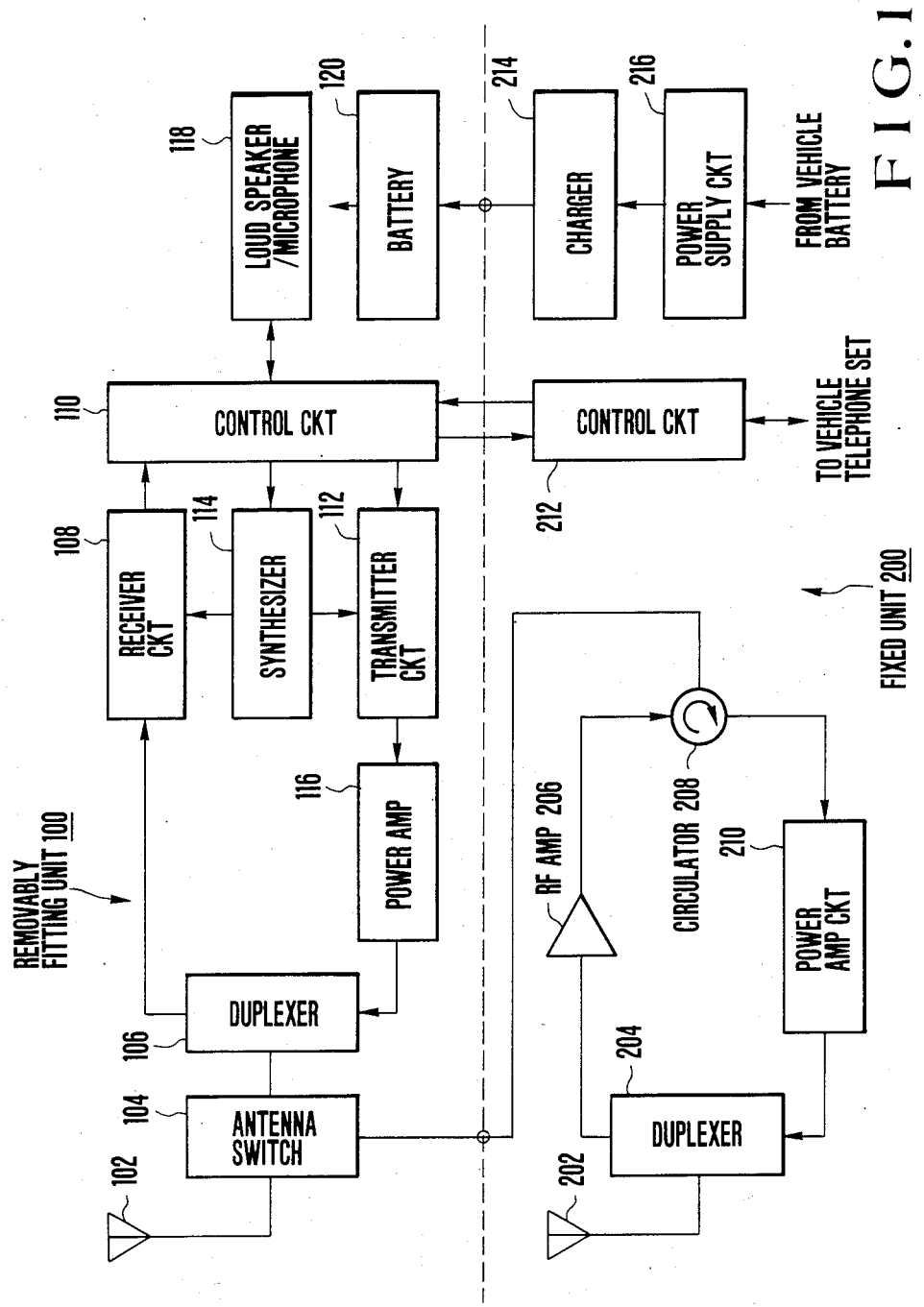
FIG. 1 is a block diagram illustrating a mobile communication system to which the present invention is applied.

In the above-mentioned detector circuit shown in FIG. 6, the switch operation is mechanically determined depending upon whether the removably fitting unit 100 and the fixed unit 200 are connected with each other or not. In addition, the embodiment shown in FIG. 6 can be modified as follows. When the both units 100 and 200 are connected with each other, signals are mutually communicated between the control circuits 110 and 212 (FIG. 1) via the connectors 126 and 223 (FIG. 6). Accordingly, by allowing the control circuit 212 provided in the fixed unit 200 to deliver a power down signal to the reference voltage producing circuit 15 provided in the removably fitting unit 100 when the control circuit 212 receives a signal indicating that an electrical connection between both the units is established, the switch 162 (FIG. 5) is turned on, thus effecting a control such that an output power level of the unit 100 is suitably suppressed.

As described above, the present invention can provide a system of varying a reference voltage from the reference voltage producing circuit 15 in accordance with an output from the detector circuit 16 for detecting that the connection of the portable communication device 100 and the power amplifier device 200 is established, thus controlling transmitter power from the power amplifier 3 provided in the portable communication device 100. This system makes it possible to suppress an excessive heat generation in the communication device which is problematic when the portable communication device is used by being accommodated into the power amplifier device.

In other words, in accordance with this system, when the portable communication device 100 has been connected to the power amplifier device 200, a control is effected in a manner to vary a reference voltage $V_f$ of the automatic output power control circuit provided in the communication device to a minimum input required for the power amplifier device 200, thus suppressing heat generation in the communication device.

What is claimed is:

1. A radio communication device comprising:
   first device means provided with a radio transmitter and a first power amplifier for amplifying an output of said radio transmitter;
   second device means adapted to be electrically coupled to said first device means and having a second power amplifier for amplifying an output of said first power amplifier when an electrical coupling is established between said first and second device means; and
   detector means coupled to said first and second device means and to said first power amplifier for detecting that said electrical coupling between said first and second device means is established, and producing information indicative of the establishment of said electrical coupling thereby effecting a control such that the output of said radio transmitter is kept at a minimum input level required for said second device means; and an automatic output control circuit coupled to said first power amplifier to control said first power amplifier depending on an output level of said first power amplifier and said connection detector circuit being coupled to said automatic output power control circuit whereby said automatic output power control circuit becomes operative to vary said output level of said power amplifier in accordance with said information from said connection detector circuit.

2. A radio communication device as set forth in claim 1, wherein said automatic output power control circuit comprises an output power detector coupled to said first power amplifier, a reference voltage producing circuit for producing a reference voltage, a differential amplifier responsive to a difference between the output level of said output power detector and said reference voltage, and a control signal converter for converting an output from said differential amplifier into a control signal for controlling said power amplifier.

3. A radio communication device as set forth in claim 2, wherein said connection detector circuit is configured as a circuit for voltage-dividing said reference voltage from said reference voltage producing circuit.

4. A radio communication device as set forth in claim 3, wherein said first device means is adapted to be removably fitted into said second device.

5. A radio communication device as set forth in claim 4, wherein said connection detector circuit includes a variable resistor and a switch responsive to the establishment of said electrical coupling between said first and said second device means.

6. A radio communication device as set forth in claim 5, wherein said connection detector circuit is provided, at said first device means, with a switch element, a contact provided at said switch element, a movable pin, and a first oonnector and at said second device means with a projection and a second connector, whereby when said first device means is fitted into said second device means, said projection pushes said pin to turn on said switch element.

7. A radio communication device as set forth in claim 4, wherein said first and second device means are respectively provided with first and second control units which communicate with each other, whereby when said first control unit is operative to deliver a power-down signal to said reference voltage producing circuit in response to information indicative of an establishment of the electrical coupling between said first and second device means to turn on a switch element, a control is effected such that an output level of said first power amplifier is suppressed to a minimum input level required for said second power amplifier.

* * * * *